(12) United States Patent
Alsmeier et al.

(10) Patent No.: US 6,201,730 B1
(45) Date of Patent: Mar. 13, 2001

(54) SENSING OF MEMORY CELL VIA A PLATELINE

(75) Inventors: Johann Alsmeier; Ulrike Gruening; Gerhard Mueller, all of Wappingers Falls; Young-Jin Park, Poughkeepsie, all of NY (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/323,363

(22) Filed: Jun. 1, 1999

(51) Int. Cl.[7] .................................................. G11C 11/24
(52) U.S. Cl. ........................ 365/149; 365/145; 365/203
(58) Field of Search .................................... 365/149, 145, 365/203

(56) References Cited

U.S. PATENT DOCUMENTS

| | | | | |
|---|---|---|---|---|
| 5,381,364 | * | 1/1995 | Chern et al. ........................ | 365/145 |
| 5,400,275 | * | 3/1995 | Abe et al. ............................ | 365/145 |
| 5,541,872 | * | 7/1996 | Lowrey et al. ...................... | 365/145 |
| 5,598,366 | * | 1/1997 | Kraus et al. ........................ | 365/145 |
| 5,991,188 | * | 11/1999 | Chung et al. ....................... | 365/145 |

* cited by examiner

Primary Examiner—Son T. Dinh
Assistant Examiner—Hien Nguyen
(74) Attorney, Agent, or Firm—Stanton C. Braden

(57) ABSTRACT

Sensing of information from a memory cell via a plateline is disclosed. The memory cell comprises a bitline coupled to a junction of a cell transistor while the other junction is coupled to an electrode of the capacitor. The bitline is coupled to a constant voltage source. A plateline is coupled to the other capacitor electrode.

46 Claims, 3 Drawing Sheets

SENSING OF MEMORY CELL VIA A PLATELINE

FIELD OF THE INVENTION

The present invention relates generally to integrated circuits. In particular, the invention relates to sensing of memory cells via a plateline.

BACKGROUND OF THE INVENTION

Referring to FIG. 1, a conventional dynamic random access memory cell 101 is shown. As shown, the memory cell comprises a cell transistor 110 and a cell capacitor 150. A first junction 111 of the transistor is coupled to the bitline 125, and a second junction 112 is coupled to the capacitor. A gate electrode 113 of the transistor is coupled to the wordline 126.

The capacitor comprises a first electrode 153 and a second electrode 157 separated by a dielectric layer 159. The first electrode 153 of the cell capacitor is coupled to the second junction of the transistor. The first electrode serves as a storage node for storing information and is typically referred to as a storage node electrode. The second electrode can be coupled to a constant voltage source 180 and is usually referred to as a plate electrode.

A plurality of cells is arranged in rows and columns to form a cell array, connected by wordlines in the row direction and bitlines in the column direction. The second or plate electrode of the cell capacitor typically serves as a common plate for the cells in the array.

The bitlines of the array are coupled to sense amplifiers to facilitate memory accesses. Each sense amplifier is coupled to a pair of bitlines. The bitline of the bitline pair containing the selected memory cell is referred to as the bitline true and the other is referred to as the bitline complement.

The memory cell is accessed by activating the wordline to render the transistor conductive, connecting the bitline to the storage node. For a read operation, information stored in the memory cell is passed through to the bitline. The charge from the memory cell produces a voltage differential on the bitline pair. The sense amplifier senses the differential voltage and amplifies it, producing a signal representing the information stored in the cell. In a write operation, the sense amplifier charges the bitline true to a voltage level that represents the information that is to be stored in the cell.

FIG. 2 is a timing diagram 201 showing the operation of a conventional memory cell. The plate electrode (PE), the bitline true (BL), the wordline (WL), and the storage node (SN) signals are shown. As shown, the plate electrode of the cell capacitor is connected to a constant voltage source $V_{pe}$ which, for example, is about $V_{blh}/2$, where $V_{blh}$ is equal the bitline high level. For a write operation 270, BL is charged to a voltage level equal to the information that is to be written into the cell. Activating the wordline, as indicated by WL=$V_{pp}$, connects the storage node to the bitline. After the data is written into the cell, the wordline is deactivated (e.g., WL=0) to isolate or float the storage node.

In preparation of a read operation 260 or a memory access, an equalization circuit equalizes the bitline pair to a voltage level of $V_{bleq}$. $V_{bleq}$, for example, is equal to about $V_{blh}/2$. Other values such as $V_{DD}/2$ are also useful. The wordline is activated to commence the read operation. Activating the wordline connects the storage node to the bitline. Depending on the value stored, the bitline is pulled high or low slightly to create a negative or positive differential voltage between on the bitline pair.

The read operation discharges the storage node to about $V_{bleq}$. To restore the information back into the memory cell, a restore operation 290 is performed after the read operation.

As described, the conventional DRAM IC senses information stored in the storage node of a cell capacitor through the junction of the cell transistor. Such a memory cell sensing scheme requires a contact between the bitline and a junction of the cell transistor. This requirement makes it difficult for cell designs having a cell area of, for example, less than $6F^2$ (where F is the minimum feature size) to accommodate the bitline contact, especially if the cell capacitor is a stack capacitor.

As evidenced from the foregoing discussion, it is desirable to provide an improved sensing scheme that facilitates smaller cell sizes.

SUMMARY OF THE INVENTION

The invention relates to sensing information from a memory cell. In accordance with the invention, sensing information from a memory cell is achieved via a plateline. The memory cell comprises a transistor coupled to a capacitor is employed. The bitline is coupled to one of the junctions of the transistor while the wordline is coupled to the gate. In one embodiment, a plateline is provided. The plateline is coupled to the capacitor and to a sense amplifier, enabling information to be sensed directly from the capacitor.

DETAILED DESCRIPTION OF THE INVENTION

The invention relates to a sensing scheme for memory cells. The sensing scheme can be employed in semiconductor integrated circuits (ICs) such as, for example, random access memories (RAMS) including dynamic RAMs (DRAMs), high speed DRAMs such as Rambus DRAMs and SLDRAMs, ferroelectric RAMs (FRAMs), synchronous DRAMs (SDRAMs), merged DRAM-logic chips (embedded DRAMs), or other types of memory ICs or logic ICs.

In accordance with the invention, the sensing scheme employs a plateline to transfer information to and from a memory cell. Sensing information through a plateline is contrary to conventional sensing schemes which sense information through a bitline.

The use of plateline sensing provides several advantages. One advantage derived from plateline sensing is the flexibility afforded to designers in designing the bitlines. For example, the bitlines of the memory array can be connected together to form a common bitline or have various orientations with respect to the wordlines (e.g., parallel, diagonal, or perpendicular). The bitlines of the array can comprise of a conductive plate to which all the memory cells are connected to form a common bitline. The conductive plate can comprise metal, doped polysilicon, or other conductive materials. The flexibility in designing bitlines facilitates smaller cell sizes, such as $6F^2$ or below.

Alternatively, the bitlines can be formed in the substrate. For example, dopants can be implanted to form heavily doped regions or wells in the silicon substrate to create buried bitlines which are located beneath the array transistors. The wells can be shaped as stripes or lines for connecting a plurality of cells. The stripes can have various orientations with respect to the wordline. The stripes are, for example, coupled together to form a common bitline. Also, a common well can be used to serve as the common bitline. Buried bitlines are advantageous as their use enables an increase in the surface area on which a capacitor (e.g. a stack capacitor) can be formed as well as providing a more planar surface for forming the capacitor, leading to improved process windows and better yields.

Figure 1:
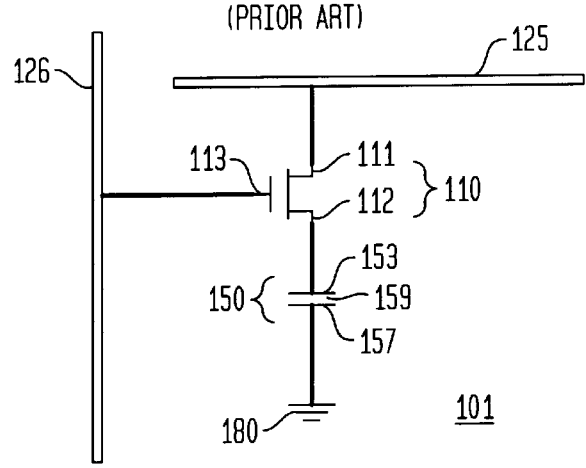
FIG. 1 shows a conventional memory cell.
Figure 2:
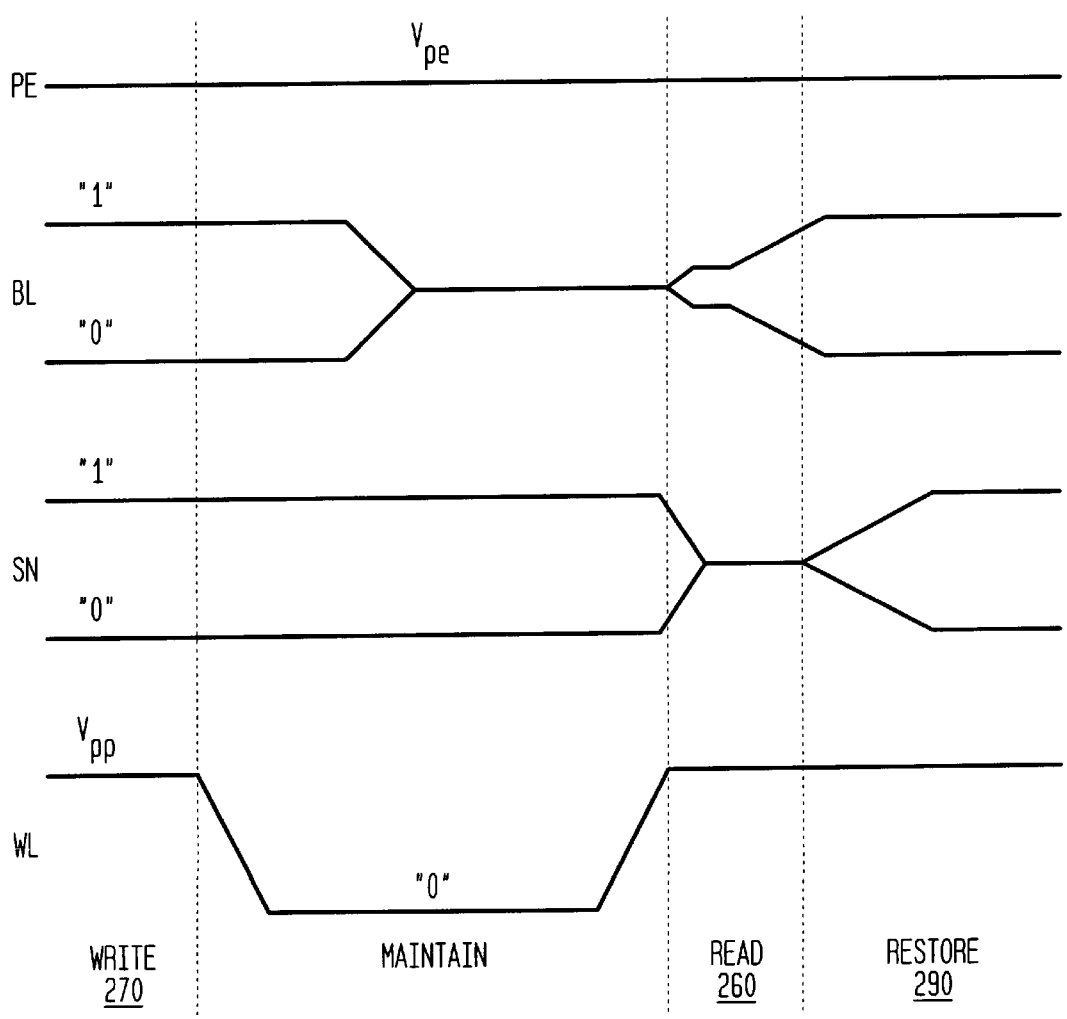
FIG. 2 shows a timing diagram of the operation of a conventional memory cell.
Figure 3A:
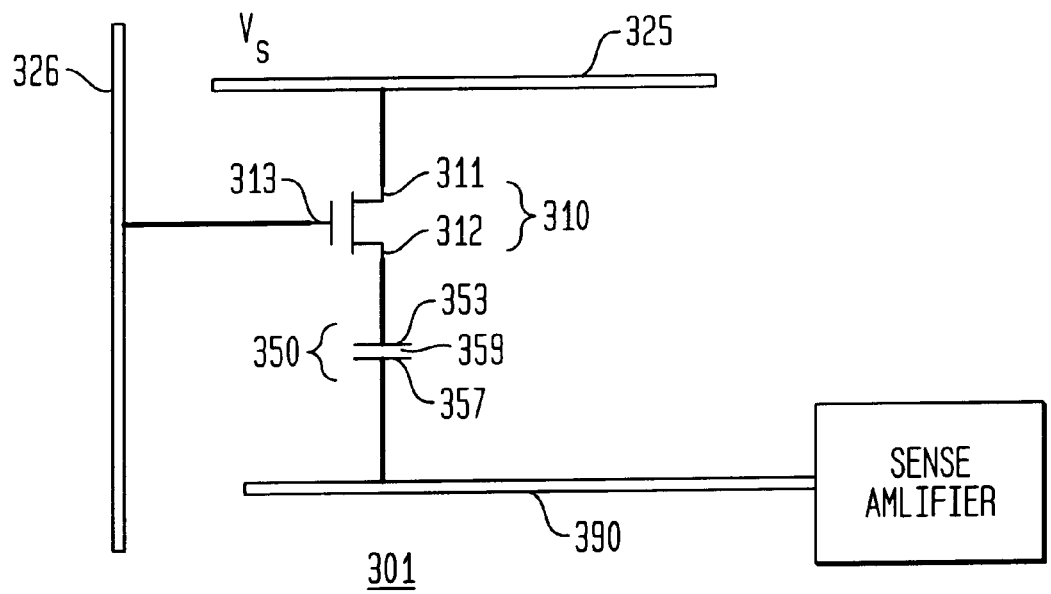
FIGS. 3a–b show embodiments of memory cells in accordance with the invention.

FIG. 3a shows a memory cell 301 in accordance with one embodiment of the invention. As shown, the memory cell comprises an access transistor 310 and a cell capacitor 350. The access transistor comprises, for example, a field effect transistor (FET), such as a p-type FET (pFET) or an n-type FET (nFET). The FET can be implemented as a vertical cell transistor. Vertical cell transistors are described in, for example, W. F. Richardson, et. al., "A trench transistor cross-point DRAM cell," 1985 IEDM Tech. Digest, p.714–717 (1985); and K. Sunouchi, et. al., "A surrounding gate transistor (SGT) cell for 64/256Mbit DRAM," 1989 IEDM Tech. Digest, p. 23–26 (1989), which are herein incorporated by reference for all purposes. The use of planar transistors or other type of transistors is also useful.

A first junction 311 of the transistor is coupled to the bitline 325. The bitline is coupled to a voltage source. The voltage source is, for example, equal to $V_s$. The bitline, in accordance with one embodiment of the invention, serves as a common bitline for the cells in the memory array. The bitline can be formed from, for example, metal, doped polysilicon, or highly doped silicon. A gate electrode 313 of the transistor is coupled to the wordline 326.

Figure 3B:
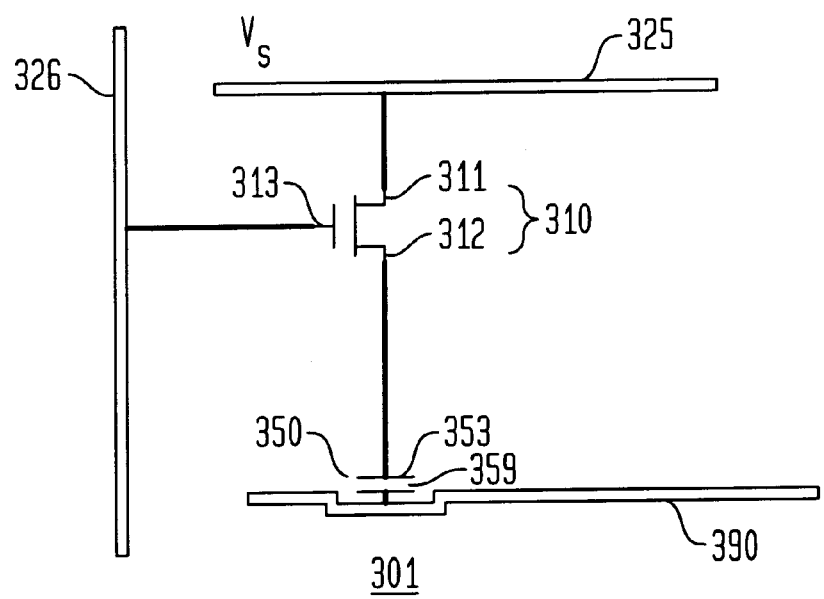

The capacitor comprises first and second cell capacitor electrodes 353 and 357 separated by a dielectric layer 359. The capacitor comprises, in one embodiment, a stack capacitor. The stack capacitor, includes, for example, a simple stacked capacitor. Other stack capacitors, such as cylindrical capacitors, capacitors which employ hemispherical grains (HSG), or capacitors which comprises high epsilon dielectrics, are also useful. Other types of capacitors such as trench capacitors and/or multi-bit capacitors are also useful. Multi-cell capacitors are described in, for example, Takashi Okuda et. al., "A four-level storage 4-Gb DRAM," IEEE J. of Solid-State Circuits, vol. 32, No. 11, Nov. p.1743–1747 (1997), which is herein incorporated by reference for all purposes. The first cell capacitor electrode 353 is coupled to the second junction of the access transistor, and the second cell capacitor electrode is coupled to a plateline 390. Providing a second cell electrode that forms a plateline 390, as shown in FIG. 3b, is also useful.

A plurality of cells is arranged in rows and columns, connected by wordlines in the row direction and platelines in the column direction. Typically, the wordlines are perpendicular to the platelines. Providing platelines which are not perpendicular to the wordlines (e.g. diagonal to the wordlines) is also useful.

In one embodiment, the platelines are coupled to sense amplifiers. The sense amplifiers, for example, can comprise conventional sense amplifiers used in memory ICs. Sense amplifiers, such as those described in co-pending U.S. patent application USSN 09/225,665, titled "Improved Sense Amplifier", which is herein incorporated by reference for all purposes, can also be employed. A sense amplifier is coupled to a pair of platelines. The plateline of the plateline pair containing the selected memory cell is referred to as the plateline true and the other is referred to as the plateline complement.

Generally, a memory cell is accessed by activating the wordline connected thereto. During a write operation, the plateline true is charged to a voltage level which depends on the information that is to be written. The plateline voltage affects the voltage in the storage node after it is floating. For a read operation, the plateline true voltage is affected by the information stored in the cell, causing a voltage differential in the plateline pair. Depending on the information in the storage node, the differential is either positive or negative. A sense amplifier senses and amplifies the voltage differential.

The charge stored in the storage node dissipates over time due to leakage, requiring a refresh operation to restore the information. One of the paths from which current leaks is through the access transistor. In accordance with one embodiment of the invention, the wordline in the inactive mode comprises a voltage potential (wordline low) which reduces the current leakage through the access transistor. For nFET access transistors, the wordline low comprises a voltage potential different from 0V. In one embodiment, the wordline low comprises a negative voltage potential. The negative wordline low potential, for example, is about −0.1 to −1.0V, preferably about −0.5V. Other negative wordline low levels are also useful.

In another embodiment, the body of the access transistor is biased at a reference potential in order to increase its gate threshold voltage ($V_T$). In one embodiment, the array well in which the access transistors are located is biased to a reference potential to bias the body of the transistor. This increases the device design flexibility. Due to the resulting higher $V_T$, the leakage current through the channel of the access transistor is reduced. For example, the body of an nFET access transistor is biased at a negative potential, such as the negative wordline low, to increase its threshold voltage.

In one embodiment, the body of the transistor is dynamically biased. Biasing the body of the transistor can be achieved by biasing the array well in which the transistors are located. The body of the transistor is biased in the non-operating mode to increase its gate $V_T$ in order to reduce leakage and increase retention time. The body voltage of the access transistor is dynamically changed in the operating mode to reduce the gate $V_T$ in order to increase its current drivability. Thus, dynamically biasing the body of the transistor advantageously improves the device performance and reduces leakage current. Dynamically biasing the body of the transistor is particularly useful for low power and silicon-on-insulator (SOI) applications.

In the case of an nFET, the body of the transistor is biased at a negative potential in the non-operating mode to increase its $V_T$ and dynamically increased to reduced its $V_T$ in the operating mode. The body of the nFET is biased from, for example, about −0.5V in the non-operating to about 0V in the operating mode. For the case of a pFET, the polarities of the bias voltages are changed accordingly.

In one embodiment, the body of the transistor can be biased by biasing the well in substrate which the transistor is located. Alternatively, the body of the transistor can be floating. In such an application, the body of the transistor can be biased by coupling the body directly to the wordline or to the bias source. This is particularly useful for $6F^2$ or less cell designs.

In an alternative embodiment, the reference voltage coupled to the bitline is dynamically controlled to improve the operation of the described plateline sensing scheme.

Figure 4:
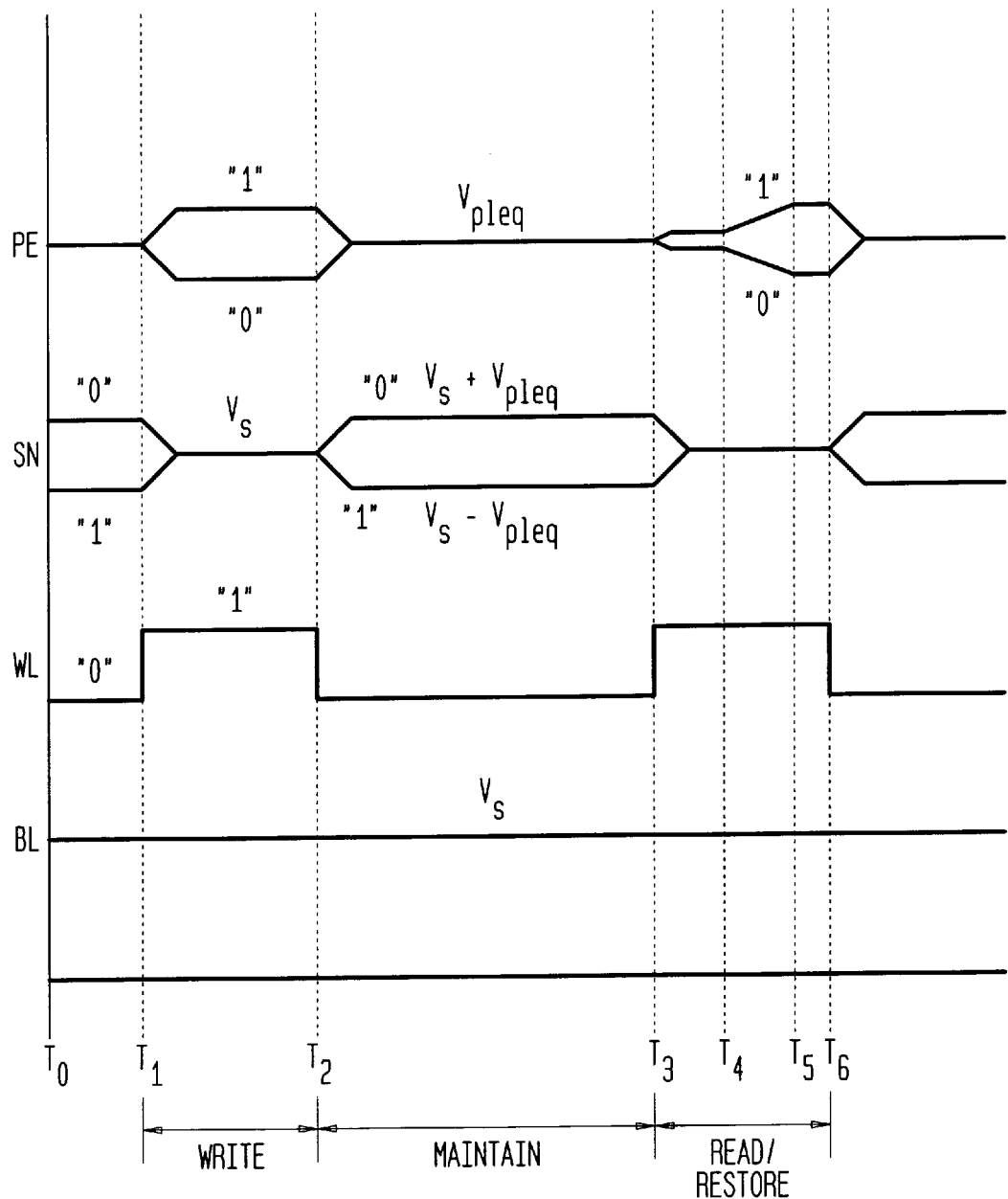
FIG. 4 shows a timing diagram of the operation of a memory cell in accordance with one embodiment of the invention.

FIG. 4 shows a timing diagram of the operations of the memory cell in accordance with one embodiment of the invention. The bitline (BL), the plateline (PL), the wordline (WL), and storage node (SN) signals are shown. The SN signal represents the data stored in the memory cell. BL is at a constant voltage level $V_s$. At time $t_0$, WL is inactive (indicated by logic 0). This isolates the storage node. PL is equalized to $V_{pleq}$ in preparation of a memory access.

At $t_1$, WL is activated (indicated by a logic 1) to commence a write operation. Activating WL couples the storage node to BL, causing SN to be precharged to the voltage potential of BL. PL is then charged to an appropriate voltage level, depending on the data that is to be written to the cell. For example, PL is charged to a high or logic 1 level (e.g., about 1–2.5V or about $2V_{pleq}$) to write a 1 or to a low or logic 0 level (e.g., about 0V) to write a 0.

At $t_2$, the WL is deactivated to isolate the storage node. In preparation of the next access, PL is equalized to $V_{pleq}$. Due to charge coupling between PL and SN, the voltage of SN is affected. If PL was at a logic 1 (e.g., $V_{pl}$ equal to about $2V_{pleq}$) during $t_1$–$t_2$, the coupling causes SN to swing down to a value of BL–$V_{pleq}$. If PL was at a logic 0 (about 0V) during $t_1$–$t_2$, then SN swings up to BL+$V_{pleq}$.

During $t_2$–$t_3$, the storage node is electrically isolated from the adjacent conductors since the WL is inactive. As a result, the charge on the cell capacitor is maintained.

At $t_3$, WL is activated to perform a read operation. The plateline is floating. Floating the plateline is achieved by isolating it from its equalizer circuitry of the sense amplifier using a plateline isolation circuit. Activating the WL electrically couples the storage node to the bitline, causing the storage node to have a voltage potential of the BL. At $t_4$, the charge coupling between the storage node and the plateline causes PL to be either pulled up or pulled down, depending on the information stored in the storage node. The pulling up or pulling down of PL creates a voltage differential in the plateline pair. For example, PL is pulled up above $V_{pleq}$ to produce a positive differential if SN is equal to a logic 1; PL is pulled down below $V_{pleq}$ to produce a negative differential if SN is equal to a logic 0. A sense amplifier senses the differential signal between the two platelines of a plateline pair and amplifies it during $t_4$–$t_5$, charging the plateline to logic 1 or logic 0, depending on the signal stored in storage node.

At $t_5$–$t_6$, the amplified signal can be transferred to other circuits. After completion of this read operation at $t_6$, WL is deactivated and the plateline equalizer is activated to charge PL to $V_{pleq}$. Since the storage node SN is isolated due to an inactive WL, the charge on the storage capacitor is maintained. Due to charge coupling between SN and PL, SN is restored to its original level prior to the read operation. As a result, the information in the cell is maintained.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A memory cell comprising:
    a transistor including a gate terminal and first and second junctions;
    a capacitor including a first and second electrodes, the first electrode coupled to the second junction of the transistor;
    a bitline coupled to the first junction;
    a wordline coupled to the gate terminal;
    a plateline coupled to the second electrode of the capacitor; and
    a sense amplifier coupled to the plateline, wherein information stored in the memory cell is sensed through the plate line.

2. The memory cell as recited in claim 1 wherein the bitline comprises a conductive strip.

3. The memory cell recited in claim 2 wherein the conductive strip can comprise any orientation with respect to the wordline.

4. The memory cell as recited in claim 3 wherein the bitline comprises a conductive material.

5. The memory cell as recited in claim 4 wherein the conductive material is selected from the group consisting metal, doped polysilicon, or doped silicon.

6. The memory cell as recited in claim 5 wherein the bitline serves as a common bitline in a memory array of an integrated circuit.

7. The memory cell as recited in claim 1 wherein bitline comprises a buried bitline formed in a substrate on which the cell is formed.

8. The memory cell as recited in claim 7 wherein the buried bitline is located in the substrate below the transistor.

9. The memory cell as recited in claim 8 wherein the buried bitline comprises a heavily doped region in the substrate.

10. The memory cell as recited in claim 9 wherein the buried bitline comprises a conductive strip.

11. The memory cell as recited in claim 10 wherein the conductive strip can comprise any orientation with respect to the wordline.

12. The memory cell as recited in claim 11 wherein the bitline is coupled to other bitlines to serve as a common bitline in a memory array of an integrated circuit.

13. The memory cell as recited in claim 9 wherein the doped region comprises a well to serve as a common bitline in a memory array of an integrated circuit.

14. The memory cell as recited in claim 7 wherein the substrate comprises a semiconductor substrate.

15. The memory cell as recited in claim 14 wherein the semiconductor substrate comprises silicon.

16. The memory cell as recited in claim 14 wherein the semiconductor substrate comprises a silicon-on-insulator substrate.

17. The memory cell as recited in claim 1 wherein a body of the transistor is coupled to a voltage source.

18. The memory cell as recited in claim 17 wherein the voltage source comprises a constant voltage source.

19. The memory cell as recited in claim 18 wherein the constant voltage source increases a gate threshold voltage of the transistor to reduce leakage current.

20. The memory cell as recited in claim 17 wherein voltage source comprises a dynamic voltage source.

21. The memory cell as recited in claim 20 wherein the dynamic voltage source increases a gate threshold voltage of the transistor to reduce leakage current in a non-operating mode and decreases the gate threshold voltage in an operating mode to increase the transistor's current drivability.

22. The memory cell as recited in claim 21 wherein the transistor comprises an nFET and the dynamic voltage source is about –0.5V in the non-operating mode and about 0V in the operating mode.

23. The memory cell as recited in claim 1 wherein the transistor comprises a vertical transistor.

24. The memory cell as recited in claim 23 wherein a body of the transistor is coupled to a voltage source.

25. The memory cell as recited in claim 24 wherein the voltage source comprises a constant voltage source.

26. The memory cell as recited in claim 25 wherein the constant voltage source increases a gate threshold voltage of the transistor to reduce leakage current.

27. The memory cell as recited in claim 24 wherein voltage source comprises a dynamic voltage source.

28. The memory cell as recited in claim 27 wherein the dynamic voltage source increases a gate threshold voltage of the transistor to reduce leakage current in a non-operating mode and decreases the gate threshold voltage in an operating mode to increase the transistor's current drivability.

29. The memory cell as recited in claim 28 wherein the transistor comprises an nFET and the dynamic voltage source is about −0.5V in the non-operating mode and about 0V in the operating mode.

30. The memory cell as recited in claim 29 wherein the capacitor comprises a stack capacitor.

31. The memory cell as recited in claim 29 wherein the capacitor comprises a trench capacitor.

32. The memory cell as recited in claim 31 wherein the capacitor comprises a trench capacitor.

33. The memory cell as recited in claim 32 wherein the plateline is coupled to a sense amplifier for sensing information.

34. The memory cell as recited in claim 33 wherein data is stored in or read from the capacitor via the plateline.

35. The memory cell as recited in claim 1 wherein the wordline in the inactive mode comprises a wordline low voltage potential that reduces current leakage through the transistor.

36. The memory cell as recited in claim 35 wherein the transistor comprises an nFET and the wordline low voltage potential comprises a negative voltage potential.

37. The memory cell as recited in claim 36 wherein the negative voltage potential is about −0.1 to −1V.

38. The memory cell as recited in claim 1 wherein the wordline comprises a wordline low potential which is negative with respect to 0V.

39. In a memory cell which includes a transistor having a first terminal coupled to a bitline, a second terminal coupled to a first plate of a capacitor and a gate coupled to a wordline, a plateline coupled to a second plate of the capacitor, and a sense amplifier coupled to the plateline, a method of operating the memory cell comprising:

selecting the memory cell; and accessing the memory cell through the plateline.

40. The method in claim 39 wherein sensing information from the memory cell comprises:

activating a transistor of the memory cell to provide an electrical path between a bitline and a second electrode of the capacitor to cause the capacitor to have a voltage potential equal to a constant voltage of the bitline; and deactivating the transistor to isolate the capacitor from the bitline, wherein coupling between the capacitor and a plateline affects the voltage in the capacitor or the plateline.

41. The method of claim 40 further comprises equalizing the plateline to an equalized voltage before activating the transistor to prepare for the sensing of information from the memory cell.

42. The method of claim 39 wherein the sensing comprises a read operation comprising:

equalizing the plateline to an equalized voltage;

activating the transistor to couple bitline to the storage node to cause the potential of the storage node to equal the constant voltage;

deactivating the wordline to isolate the storage node.

43. The method of claim 42 wherein the read operation further comprises sensing a differential voltage on a plateline pair comprising the plateline and a plateline complement.

44. The method of claim 39 wherein the sensing comprises a write operation comprising:

activating the transistor to couple bitline to the storage node to cause the potential of the storage node to equal the constant voltage;

charging the plateline to a plateline voltage level representing the data to be written into the memory cell;

deactivating the wordline to isolate the storage node, wherein the plateline voltage affects the voltage in the capacitor due to coupling between the plateline and capacitor.

45. The method of claim 44 further comprises equalizing the plateline to the equalized voltage after deactivating the wordline to affect the voltage in the capacitor.

46. The method of claim 44 wherein deactivating the wordline comprises a negative wordline low potential.

* * * * *